US010742173B2

(12) United States Patent
Maalouf et al.

(10) Patent No.: US 10,742,173 B2
(45) Date of Patent: Aug. 11, 2020

(54) SYSTEMS AND METHODS FOR FAST SWITCHING TIME DIVISION DUPLEX OPERATION OF POWER AMPLIFIERS (71) Applicant: NXP USA, Inc., Austin, TX (US)

(72) Inventors: Elie Maalouf, Mesa, AZ (US); Joseph Staudinger, Gilbert, AZ (US); Don Hayes, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/139,671

(22) Filed: Sep. 24, 2018

(65) Prior Publication Data
US 2020/0099344 A1 Mar. 26, 2020

(51) Int. Cl.
H03F 1/02 (2006.01)
H03F 1/30 (2006.01)
H03F 3/193 (2006.01)

(52) U.S. Cl.
CPC ......... H03F 1/0288 (2013.01); H03F 1/0211 (2013.01); H03F 1/301 (2013.01); H03F 2200/18 (2013.01); H03F 2200/366 (2013.01)

(58) Field of Classification Search
USPC ............. 330/285, 296, 310, 124 R, 295, 307
See application file for complete search history.

(56) References Cited

U.S. PATENT DOCUMENTS 6,731,173 B1    5/2004  Thompson
7,064,615 B2    6/2006  Krvavac et al.
7,994,861 B2 *  8/2011  Fisher ................. H03F 1/302
                                                        327/535
9,577,954 B2    2/2017  Williams et al.
9,806,679 B2 * 10/2017  Gorbachov ............ H03F 1/301
2007/0111686 A1  5/2007  Lee
2012/0146731 A1  6/2012  Khesbak
2012/0286873 A1 11/2012  Li et al.
2016/0241210 A1  8/2016  Andrys et al.
2017/0077877 A1  3/2017  Anderson

OTHER PUBLICATIONS

Ying Zhang, et al., "Bias circuit design of RF power amplifiers for TDD systems", 2011 International Conference on Electronics, Communications and Control (ICECC), pp. 2572-2575.
Donna Vigneri, "An Adaptive LDMOS Gate Bias Module With Gate Voltage Windowing".
Vigneri, Donna; "Adaptive Gate Bias Module Ensures Amplifier Performance"; Microwave Journal MTT-S IMS Show Issue, vol. 59, Ed. 4; 9 pages (Apr. 15, 2016).

* cited by examiner

Primary Examiner — Hieu P Nguyen (57) ABSTRACT

Power amplifiers, amplifier systems, and related methods are disclosed herein. In one example embodiment, the amplifier system includes a bias controller that enables fast switching between an on state bias voltage and an off state bias voltage for the power amplifier. The bias controller can transition a low impedance switch to an on state to electrically couple a first electrode of a charge holding capacitor to an input of the power amplifier. The charge holding capacitor can be pre charged with the on state bias voltage to quickly provide the on state bias voltage to the power amplifier. The bias controller can also transition the low impedance switch to an off state to couple the input of the power amplifier to the off state bias voltage.

20 Claims, 5 Drawing Sheets

SYSTEMS AND METHODS FOR FAST SWITCHING TIME DIVISION DUPLEX OPERATION OF POWER AMPLIFIERS

FIELD

Embodiments of the subject matter described herein relate generally to radio frequency (RF) amplifiers and related methods of operation.

BACKGROUND

Wireless communication systems employ power amplifiers for increasing the power of radio frequency (RF) signals. In a wireless communication system, a power amplifier forms a portion of the last amplification stage in a transmission chain before provision of the amplified signal to an antenna for radiation over the air interface. High gain, high linearity, stability, and a high level of power-added efficiency are characteristics of a desirable amplifier in such a wireless communication system.

In general, a power amplifier operates at maximum power efficiency when the power amplifier transmits close to saturated power. However, power efficiency tends to worsen as output power decreases. Recently, the Doherty amplifier architecture has been the focus of attention not only for base stations but also for mobile terminals because of the architecture's high power-added efficiency over a wide power dynamic range. The high efficiency of the Doherty architecture makes the architecture desirable for current and next-generation wireless systems.

RF power amplifiers use fast on and off switching for Time Division Duplexing (TDD). In addition, the RF baseband signal is bypassed to ground at an RF power amplifier's bias voltage input. Current amplifier designs often employ large RF bypass capacitors for this purpose, which prevent unwanted spurious modulation of the RF signal. However, such RF bypass capacitors may require large current charging surges to bias the RE amplifiers on and off. Newer RF power amplifier applications, such as those used in multiple-input, multiple-output (MIMO) systems, would be better served by faster switching and lower power consumption than is achievable with designs that utilize large RF bypass capacitors that need to be charged and discharged using conventional methods.

In view of the above, there is a need for improved amplifiers and related methods of operation that address one or more of the above concerns, or other concerns, associated with conventional amplifiers, and/or provide one or more advantages by comparison with conventional amplifiers.

DETAILED DESCRIPTION

A typical two-way Doherty amplifier implementation includes a carrier amplifier and a peaking amplifier that provide separate paths configured to amplify carrier and peaking signals, respectively. In a Doherty amplifier, the input radio frequency (RF) signal applied to respective power transistors of the carrier amplifier and the peaking amplifier are biased with a direct current (DC) voltage to set the operating mode of each transistor. A bias controller can be combined with Doherty amplifiers having imbedded reference devices to dynamically apply the suitable biasing voltages to the first and second carrier amplifier transistors and the first and second peaking amplifier transistors. Embodiments encompassed by the present disclosure include embodiments having a bias controller employing charge holding capacitors and switches to facilitate fast switching of the peaking and carrier amplifiers between respective on states and off states by application of corresponding bias voltages. Implementation of the various embodiments may greatly reduce charging currents by providing a low impedance switch between the RF amplifier and an RF baseband bypass capacitor. By reducing the changing currents, components for generating bias voltages and the switches can be implemented in a low power and low cost process such as CMOS.

Figure 1:
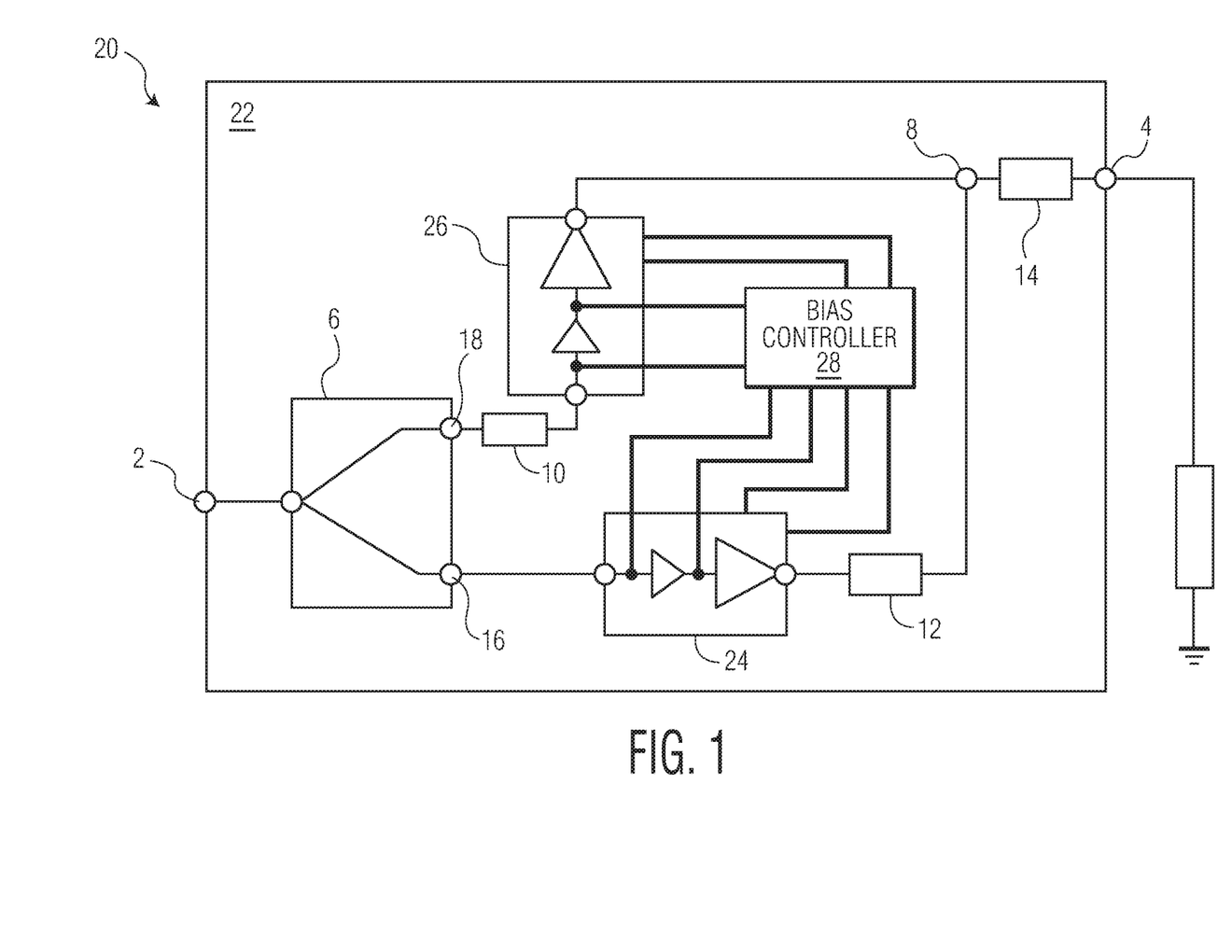
FIG. 1 is a schematic diagram of a Doherty amplifier, in accordance with an example embodiment.

FIG. 1 is a schematic diagram of a Doherty amplifier system 20, in accordance with an example embodiment. In some embodiments, the amplifier system 20 may be implemented in the transmit chain of a transceiver that supports a transmit function and a receive function in a time division duplex (TDD) manner. Such a transceiver may include, for example, a transmit chain and a receive chain coupled through a single pole, double throw (SPDT) switch (TDD switch) to a system antenna. A transceiver controller may produce various control signals (e.g., switch control signals) that configure the transceiver to provide the transmit function or the receive function at any given time. When the transceiver is configured to provide the transmit function, the transmit chain of the transceiver is electrically connected through the TDD switch to the system antenna for radiation, over an air interface, of an amplified RF signal produced by the amplifier system 20. When the transceiver is configured to provide the receive function, the transmit chain of the transceiver is uncoupled from the antenna. Instead, a receive chain of the transceiver is electrically coupled through the TDD switch to the system antenna, and the receive chain receives and amplifies an RF signal from the antenna.

Figure 2:
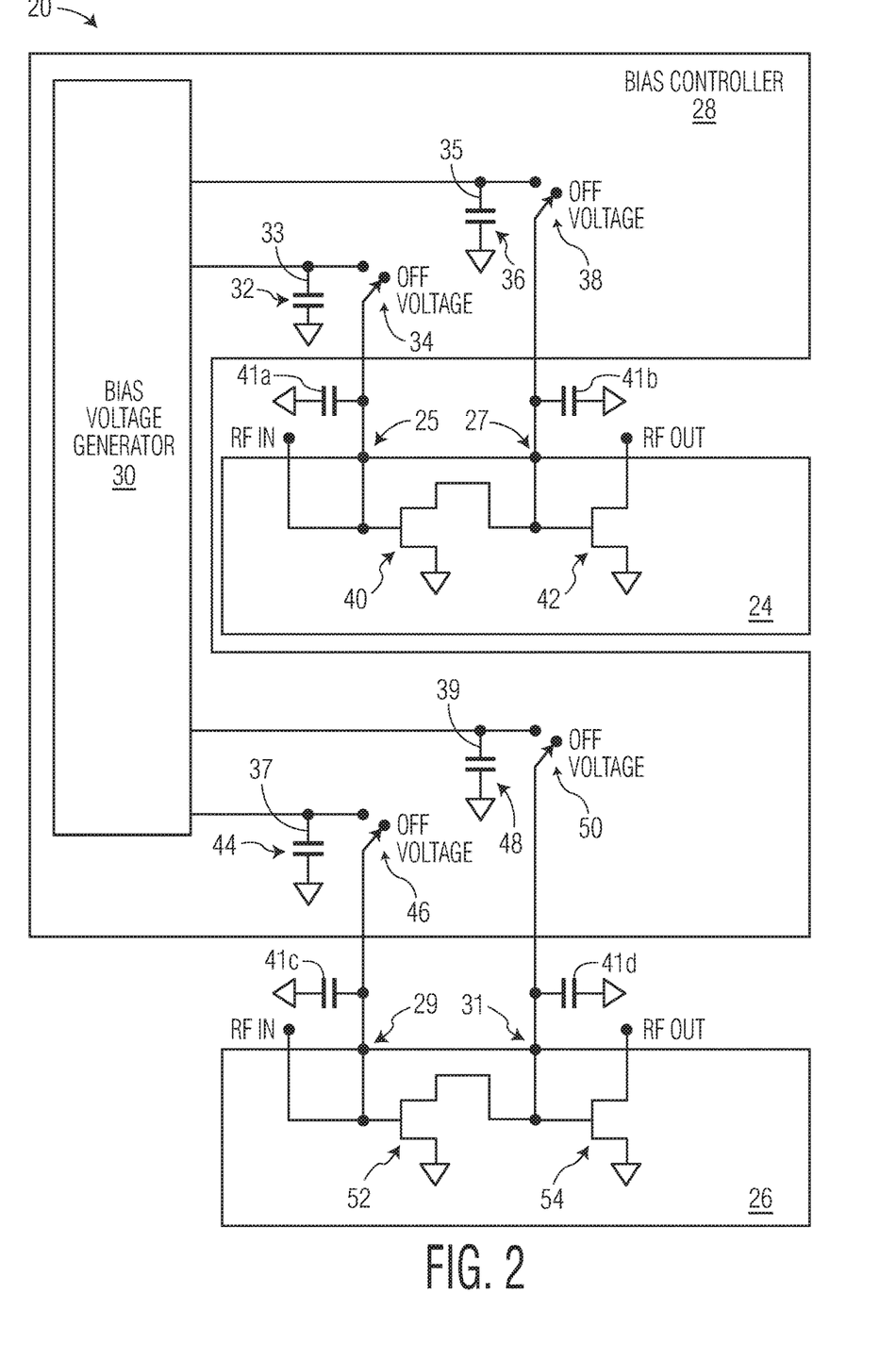
FIG. 2 is an additional schematic diagram showing interconnections between components of a bias controller, a carrier device, and a peaking device as can be employed in a Doherty amplifier such as that of FIG. 1.

As indicated in FIG. 1, some or all components of the Doherty amplifier system 20 may be implemented in a single device package or module 22. As will be explained in detail later, and in accordance with various embodiments. The Doherty amplifier system 20 includes a dual stage carrier amplifier 24, a dual stage peaking amplifier 26, and a bias controller or 28. In some embodiments, the bias controller 28 is electrically coupled to both the dual stage carrier amplifier 24 and the dual stage peaking amplifier 26 with eight distinct connections. Additionally as shown, the Doherty amplifier system 20 also includes an RF input node 2, an RF output node 4, a power splitter 6, a combining node 8, and first, second, and third phase shift/impedance inversion/matching components 10, 12, and 14, respectively. The dual stage carrier amplifier 24 and dual stage peaking amplifier 26 particularly are coupled in parallel between the power splitter 6 and combining node 8. The dual stage carrier amplifier 24 particularly is coupled between the combining node 8 and a first output port 16 of the power splitter 6, with the second phase shift/impedance inversion/matching component 12 being coupled between that amplifier and the combining node 8. The dual stage peaking amplifier 26 particularly is coupled between a second output port 18 of the power splitter 6 and the combining node 8, with the first phase shift/impedance inversion/matching component 10 being coupled between the second output port 18 and that amplifier. The combining node 8 is in turn coupled to the RF output node 4 by way of the third phase shift/impedance inversion/matching component 14 coupled therebetween, FIG. 2 is a schematic diagram showing the internal components of and interconnections between, the dual stage carrier amplifier 24, the dual stage peaking amplifier 26, and the bias controller 28, in accordance with an example embodiment. As indicated in FIG. 2, the bias controller 28 can include a bias voltage generator 30 configured to generate one or more bias voltages at one or more outputs of the bias voltage generator 30, a first charge holding capacitor 32, a first switch 34, a second charge holding capacitor 36, a second switch 38, a third charge holding capacitor 44, a third switch 46, a fourth charge holding capacitor 48, and a fourth switch 50. In some embodiments, the first, second, third, and fourth switches 34, 38, 46, and 50 and at least some portion of the bias voltage generator 30 are integrally formed together on a single integrated circuit chip. In some embodiments, the first, second, third, and fourth switches 34, 38, 46, and 50 can be low impedance switches. Additionally or alternatively, the first, second, third, and fourth switches 34, 38, 46, and 50 can include low power devices. The dual stage carrier amplifier 24 can include a first input 25 coupled to a first power amplifier (PA) device 40, and a second input 27 coupled to a second PA device 42, and the dual stage peaking amplifier 26 can include a first input 29 coupled to a third PA device 52, and a second input 31 coupled to fourth PA device 54.

The first PA device 40 and the third PA device 52 respectively can be or include a pre-driver stage of the dual stage carrier amplifier 24 and the dual stage peaking amplifier 26, respectively. The second PA device 42 and the fourth PA device 54 respectively can be or include an output driver stage of the dual stage carrier amplifier 24 and the dual stage peaking amplifier 26, respectively. In some embodiments the first, second, third, and fourth PA devices 40, 42, 52, and 54 can be power transistors. In such embodiments, the respective inputs 25, 27, 29, and 31 of each of the first, second, third, and fourth PA devices 40, 42, 52, and 54 can be electrically coupled to respective control terminals or gates of the respective transistors of those respective PA devices.

In RF PA 24, the first and second PA devices 40, 42 are connected in a cascaded arrangement between an RF input (RF IN) and an RF output (RF OUT). More particularly, and as shown, the control terminal (e.g., the gate) of the first PA device 42 is electrically coupled to RF IN (e.g., to output 16 of power splitter 6, FIG. 1), and one current-carrying terminal (e.g., the drain) of the first PA device 40 is electrically coupled to the control input (e.g., the gate) of the second PA device 42. A current-carrying terminal (e.g., the drain) of the second PA device 42 is electrically coupled to RF OUT (e.g., to the combining node 8, FIG. 1). The second current-carrying terminals (e.g., the sources) of the first and second PA devices 40, 42 may be electrically connected to a ground reference. In this regard, it should be appreciated that, in the context of the embodiment of FIG. 2. (and FIG. 1) in which the Doherty amplifier system 20 employs the dual stage carrier amplifier 24 that includes the first and second PA devices 40 and 42, the control input of the first PA device 40 is the node at which a RF input signal is received by the cascaded arrangement of PA devices for amplification by those devices. Additionally, the drain of the second PA device 42 is the node at which an RF output signal is output by the cascaded arrangement of PA devices, with the RF output signal being an amplified version of the RF input signal after being amplified by those PA devices.

In RF PA 26, the third and fourth PA devices 52, 54 are connected in a cascaded arrangement between an RF input (RF IN) and an RF output (RF OUT). More particularly, and as shown, the control terminal (e.g., the gate) of the third PA device 52 is electrically coupled to RF IN (e.g., to output 18 of power splitter 6, FIG. 1), and one current-carrying terminal (e.g., the drain) of the third PA device 52 is electrically coupled to the control input (e.g., the gate) of the fourth PA device 54. A current-carrying terminal (e.g., the drain) of the fourth PA device 54 is electrically coupled to RF OUT (e.g., to the combining node 8, FIG. 1). The second current-carrying terminals (e.g., the sources) of the third and fourth PA devices 52, 54 may be electrically connected to a ground reference. In this regard, it should be appreciated that, in the context of the embodiment of FIG. 2 (and FIG. 1) in which the Doherty amplifier system 20 employs the dual stage peaking amplifier 26 that includes the third and fourth PA devices 52 and 54, the control input of the third PA device 52 is the node at which a RF input signal is received by the cascaded arrangement of PA devices for amplification by those devices. Additionally, the drain of the fourth PA device 54 is the node at which an RF output signal is output by the cascaded arrangement of PA devices, with the RF output signal being an amplified version of the RF input signal after being amplified by those PA devices.

A respective first electrode 33, 35, 37, and 39 of each of the first, second, third, and fourth charge holding capacitors 32, 36, 44, and 48 can be coupled to a respective output of the bias voltage generator 30, and a respective second electrode of each of the first, second, third, and fourth charge holding capacitors 32, 36, 44, and 48 can be coupled to a ground reference voltage. Each of the first, second, third, and fourth switches 34, 38, 46, and 50 may include a three-terminal, single pole, double throw (SPDT) switch, which is implemented as one or more integrated transistors, in an embodiment. The state of each switch 34, 38, 46, 50 is controlled by switch control signals to a common or control terminal (e.g., gate(s)) of the switch transistor(s). For example, in one embodiment the switch control signals may be received from a transceiver controller, in an embodiment, which configures the transceiver to provide a transmit function or a receive function. In another embodiment, the switch control signals may be received from switching logic components of the bias voltage generator 30. In a further embodiment, the bias voltage generator 30 can receive an Enable On or an Enable Off signal from the transceiver controller and can forward the Enable On or Enable Off signal to the switches 34, 38, 46, 50 as the switch control signals. In such embodiments, the Enable On signal can be received when the transceiver is in the transmit state and the Enable Off signal can be received when the transceiver is in the receive state. When the Enable On signal is transmitted by the transceiver controller, the switches 34, 38, 46, 50 can be transitioned to a first state (e.g. an "on state") as disclosed herein. When the Enable Off signal is transmitted by the transceiver controller, the switches 34, 38, 46, 50 can be transitioned to a second state (e.g. an "off state") as disclosed herein.

As indicated in FIG. 2, a respective first terminal of each of the first, second, third, and fourth switches 34, 38, 46, and 50 can be coupled to the first electrodes 33, 35, 37, and 39, respectively, and a respective second terminal of the of each of the first, second, third, and fourth switches 34, 38, 46, and 50 can be coupled to the first input 25 of the dual stage carrier amplifier 24, the second input 27 the dual stage carrier amplifier 24, the first input 29 of the dual stage peaking amplifier 26, and the second input 31 the dual stage peaking amplifier 26, respectively. A respective third terminal of each of the first, second, third, and fourth switches 34, 38, 46, and 50 can be coupled to an "off state" bias voltage reference (e.g., a ground reference voltage or other voltage). In the first state, each switch 34, 38, 46, 50 provides an electrically conductive path between the first and second terminals (i.e., between the first electrodes 33, 35, 37, 39 and the first inputs 25, 27, 29, 31). In the second state, each switch 34, 38, 46, 50 provides an electrically conductive path between the second and third terminals (i.e., between the first inputs 25, 27, 29, 31 and the "off" voltage reference). In some embodiments, the first state can be an "on state" for the switches 34, 38, 46, 50 and the second state can be an "off state" for the switches switch 34, 38, 46, 50.

In operation, the first switch 34 can selectively couple, based on a first control signal, the first input 25 between the first electrode 33 and a first off state bias voltage, and, when the first input 25 of the dual stage carrier amplifier 24 is electrically coupled to the first electrode 33, the first charge holding capacitor 32 provides a first on state bias voltage to the first input 25 of the dual stage carrier amplifier 24. In some embodiments, the first charge holding capacitor 32 can be pre-charged to the on state bias voltage when the system 20 is powered on or initiated. In some embodiments, a capacitance value of the first charge holding capacitor 32 is greater than a capacitance value of an RF-gate decoupling capacitor 41a coupled between the first input 25 of the dual stage carrier amplifier 24 and a ground reference. In some embodiments, the RF-gate decoupling capacitor 41a can be partially or fully integrated into a same IC die as the dual stage carrier amplifier 24. In some embodiments, the difference in capacitance values can be several orders of magnitude. For example, in some embodiments, the RF-gate decoupling capacitor 41a can have a value approximately in the range of about 10 picofarads (pF) to about 30 pF, and the first charge holding capacitor 32 can have a value of approximately 1 nanofarad (nF). However, it should be noted that additional values and ranges of capacitance values are contemplated. The difference in the capacitance value of the first charge holding capacitor 32 and the capacitance value of the RF-gate decoupling capacitor 41a enables the first switch 34 to rapidly switch between connecting the first input 25 of the dual stage carrier amplifier 24 to the first electrode 33 and connecting the first input 25 of the dual stage carrier amplifier 24 to the off state voltage. Additionally, including the first charge holding capacitor 32 can substantially reduce the amount of current flow needed to charge the RF-gate decoupling capacitor 41a. The low charging current also enables the first switch 34 and other components of the system 20 to be low power devices such as CMOS transistors, which can save manufacturing cost and lower the total energy used by the system.

Substantially similar or identical design considerations are applicable to the second, third, and fourth charge holding capacitors 36, 44, and 48 and RF-gate decoupling capacitors 41b, 41c, and 41d coupled to the inputs 27, 29, and 31, respectively. The second switch 38 can selectively couple, based on a second control signal, the second input 27 between the first electrode 35 and a second off state bias voltage, and, when the second input 27 of the dual stage carrier amplifier 24 is electrically coupled to the first electrode 35, the second charge holding capacitor 36 provides a second on state bias voltage to the second input 27 of the dual stage carrier amplifier 24. The third switch 46 can selectively couple, based on a third control signal, the first input 29 between the first electrode 37 and a third off state bias voltage, and, when the first input 29 of the dual stage peaking amplifier 26 is electrically coupled to the first electrode 37, the third charge holding capacitor 44 provides a third on state bias voltage to the first input 29 of the dual stage peaking amplifier 26. The fourth switch 50 can selectively couple, based on a fourth control signal, the second input 31 between the first electrode 39 and a fourth off state bias voltage, and, when the second input 31 of the dual stage peaking amplifier 26 is electrically coupled to the first electrode 39, the fourth charge holding capacitor 48 provides a fourth on state bias voltage to the second input 31 of the dual stage peaking amplifier 26. In some embodiments, the second, third, and fourth charge holding capacitors 38, 44, and 48 can be pre-charged to the second, third, and fourth on state bias voltages, respectively, when the system 20 is powered on or initiated. In some embodiments, the first, second, third, and fourth switches 34, 38, 46, and 50 can transition between the aforementioned first and second states in less than one micro second.

Furthermore, when the first, second, third, and fourth switches 34, 38, 46, and 50 are coupled to the electrodes 33, 35, 37, and 39 of the first, second, third, and fourth charge holding capacitors 32, 38, 44, and 48, respectively, the first, second, third, and fourth charge holding capacitors 32, 38, 44, and 48 charge the RF-gate decoupling capacitors 41a, b,c,d. Charging the RF-gate decoupling capacitors 41a,b,c,d provides a bias voltage to the gates of the first, second, third, and fourth PA device 40, 42, 52, and 54. The process of charging the RF-gate decoupling capacitors 41a,b,c,d can cause the first, second, third, and fourth charge holding capacitors 32, 38, 44, and 48 to very slightly discharge. When the discharge occurs, the bias voltage generator 30 can replace or add back the lost charge to maintain the voltage/charge on the first, second, third, and fourth charge holding capacitors 32, 38, 44, and 48 for both on & off operation of the first, second, third, and fourth PA device 40, 42, 52, and 54. Additionally, including the first, second, third, and fourth charge holding capacitors 32, 38, 44, and 48 can substantially reduce the amount of current flow needed to charge the RF-gate decoupling capacitor 41a,b,c,d. The low charging current also enables the first, second, third, and fourth switches 34, 38, 46, and 50 and other components of the system 20 to be low power devices such as CMOS transistors, which can save manufacturing cost and lower the total energy used by the system.

In some embodiments, the first control signal, the second control signal, the third control signal, and the fourth control signal all are equal or identical with one another. In some embodiments, the first control signal is equal or identical to the second control signal and the third control signal is equal or identical to the fourth control signal. For example, in some embodiments, first, second, third, and fourth control signals can be synchronized to operate the first, second, third, and fourth switches 34, 38, 46, and 50 simultaneously and can have equal value (e.g. voltage). Additionally or alternatively the first, second, third, and fourth control signals can have an equal value but not be synchronized. The first, second, third, and fourth on state voltages may be in a range of about 0.5 volts to about 2 volts for silicon devices and in a range of −4 volts to −1 volts for III/V semiconductor devices such as Gallium Nitride device, in an embodiment, although these voltages may be lower or higher, as well. In an embodiment, the first on state voltage for the dual stage carrier amplifier 24 is equal to the second on state voltage for the dual stage carrier amplifier 24, the third on state voltage for the dual stage peaking amplifier 26, and the fourth on state voltage for the dual stage peaking amplifier 26. In other embodiments, some or all of the first, second, third, and fourth on state voltages may be different from each other. Additionally or alternatively, the first off state voltage for the dual stage carrier amplifier 24 is equal to the second off state voltage for the dual stage carrier amplifier 24, the third off state voltage for the dual stage peaking amplifier 26, and the fourth off state voltage for the dual stage peaking amplifier 26, and, in some embodiments all of the first, second, third, and fourth off state voltages are a ground reference voltage. In other embodiments, some or all of the first, second, third, and fourth off state voltages may be different from each other. In some embodiments some or all of the first, second, third, and fourth off state voltages may be a sub threshold negative voltage, for example, when any of the PA devices 40, 42, 52, or 54, are depletion mode devices.

Figure 3:
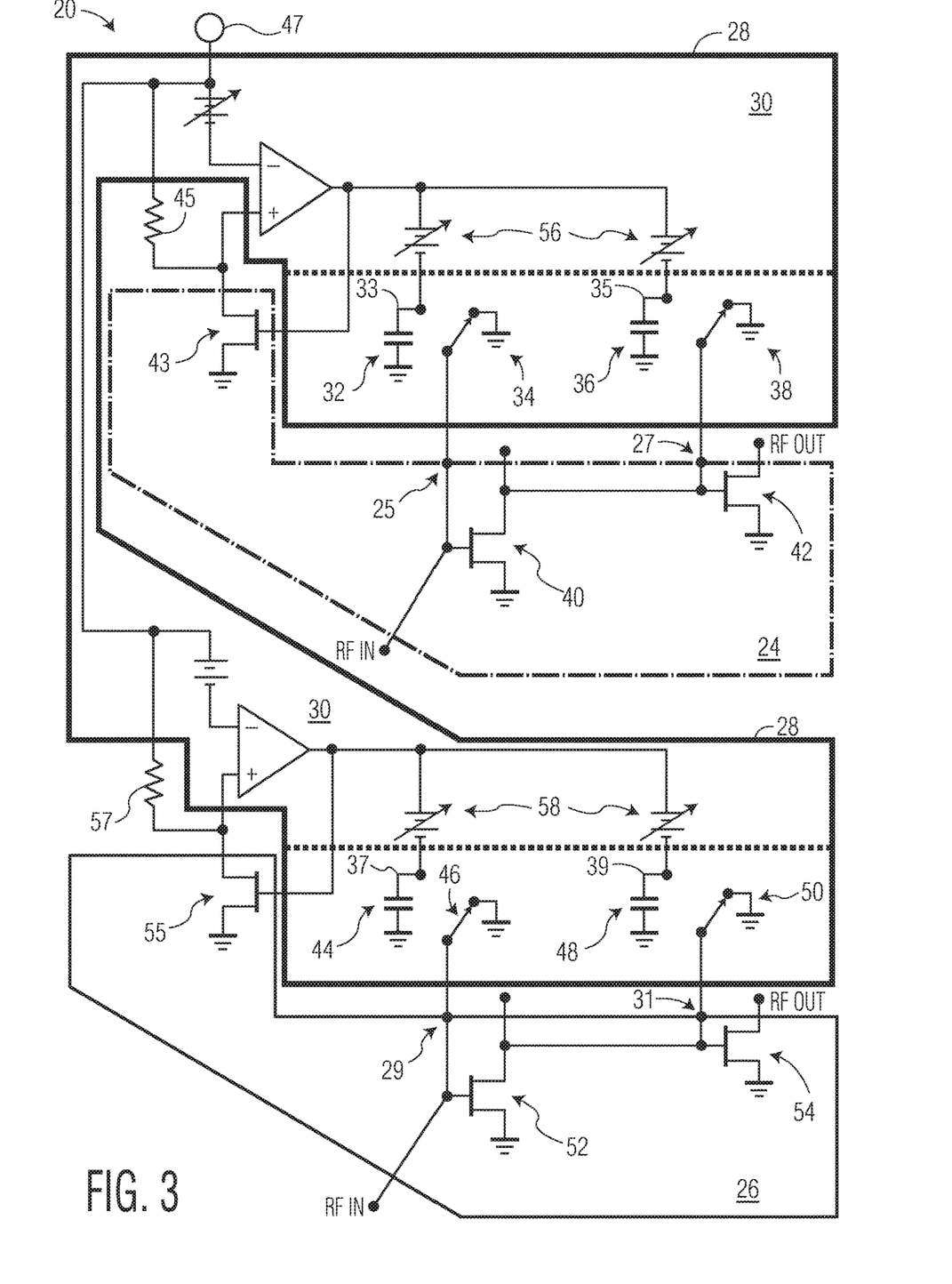
FIG. 3 is an additional a schematic diagram representing the interconnections between components of a bias controller, a carrier device; and a peaking device as shown in FIG. 2, in accordance with an example embodiment.

FIG. 3 is a schematic diagram showing additional components of an embodiment of the Doherty amplifier system 20. As seen in FIG. 3, a first reference device 43 (transistor) can be integrally formed on a single die with the first PA device 40 and the second PA device 42 so that the first reference device 43 will match the first PA device 40 and the second PA device 42 in terms of part to part (die to die) process and temperature variations. A second reference device 55 (transistor) can be integrally formed on a single die with the third PA device 52 and the fourth PA device 54 so that the second reference device 55 will match the third PA device 52 and the fourth PA device 54 in terms of part to part (die to die) process and temperature variations. In some configurations, a first high tolerance drain resistor 45 is electrically coupled between a DC voltage source 47 and a current-carrying terminal (e.g., drain) of the first reference device 43 and a second high tolerance drain resistor 57 is electrically coupled between the DC voltage source 47 and a current-carrying terminal (e.g., drain) of the second reference device 55. For example, the resistors 45, 57 may have a resistance value in a range of about 100 ohms to about 1000 ohms, although the resistance value may be higher or lower, as well. Multiple voltage values are contemplated for the DC voltage source 47, including, but not limited to, 3.3 volts and 5 volts with a tolerance of +/−5%. The bias voltage generator 30 can monitor voltage drops across the first and second high tolerance drain resistors 45, 57, adjust a control voltage input into the gate of the first and second reference devices 43 and 55 based on the values of the voltages drops, and offset the adjusted control voltage to dynamically apply a suitable biasing voltage to the first, second, third, and fourth PA devices 40, 42, 52, and 54. For example, the control voltage can be adjusted to a value that causes the voltage drops across the first and second high tolerance drain resistors 45, 57 to be equal to a preconfigured reference voltage.

As discussed above, the amplifier system 20 may be implemented in the transmit chain of a transceiver that supports a transmit function and a receive function in a TDD manner. As indicated in FIG. 3 the bias voltage generator 30 can include switching logic 56 and 58 that drives the outputs of the bias voltage generator 30 between the first, second, third, and fourth on state voltages and the first, second, third, and fourth off state voltage based on whether the transceiver state is to support the transmit or receive function. In some embodiments, the switching logic 56 and 58 includes digital to analog converters that can offset the control voltage applied to the first and second reference devices 43 and 55 by preconfigured offset voltages to set an operating mode of the first, second, third, and fourth PA devices 40, 42, 52, and 54. Specifically, in some embodiments, the digital to analog converters can lower the control voltage by the preconfigured offset voltage.

In some embodiments, the switching of the transceiver between the transmit or receive function is synchronized with the first, second, third, and fourth control signals applied to the first, second, third, and fourth switches 34, 38, 46, and 50. In such embodiments, when the switching logic 56 and 58 drives the outputs of the bias voltage generator 30 to the first, second, third, and fourth on state voltages, the first, second, third, and fourth switches 34, 38, 46, and 50, electrically couple the inputs 25, 27, 29, and 31 of the dual stage carrier amplifier 24 and the dual stage peaking amplifier 26 to the first electrodes 33, 35, 37, and 39 of the charge holding capacitors 32, 36, 44 and 48. When the transceiver is switched to the transmit function and the inputs 25, 27, 29, and 31 are coupled to the first electrodes 33, 35, 37, and 39, the charge holding capacitors 32, 36, 44, 48 immediately provide the first, second, third, and fourth on state voltages to the inputs 25, 27, 29, and 31 of the dual stage carrier amplifier 24 and the dual stage peaking amplifier 26. When the transceiver is switched to the receive function and the switching logic 56 and 58 drives the outputs of the bias voltage generator 30 to the first, second, third, and fourth off state voltages, the first, second, third, and fourth switches 34, 38, 46, and 50 electrically couple the inputs 25, 27, 29, and 31 of the dual stage carrier amplifier 24 and the dual stage peaking amplifier 26 to the first, second, third, and fourth off state voltages. In some embodiments, the first, second, third, and fourth switches 34, 38, 46, and 50 directly apply the off state voltages to the inputs 25, 27, 29, and 31 of the dual stage carrier amplifier 24 and the dual stage peaking amplifier 26.

It should be noted that while the above description describes the bias controller 28 operating with respect to a Doherty amplifier system 20 including multiple dual stage power amplifier devices (e.g., the dual stage carrier amplifier 24 and the dual stage peaking amplifier 26), various other embodiments are contemplated. These embodiments include but are not limited to embodiments employing a bias controller similar to bias controller 28 that operates with respect to either a single one stage power amplifier device, a single dual stage power amplifier device, or a Doherty power amplifier with a one stage carrier amplifier device and a one stage peaking amplifier device.

Figure 4:
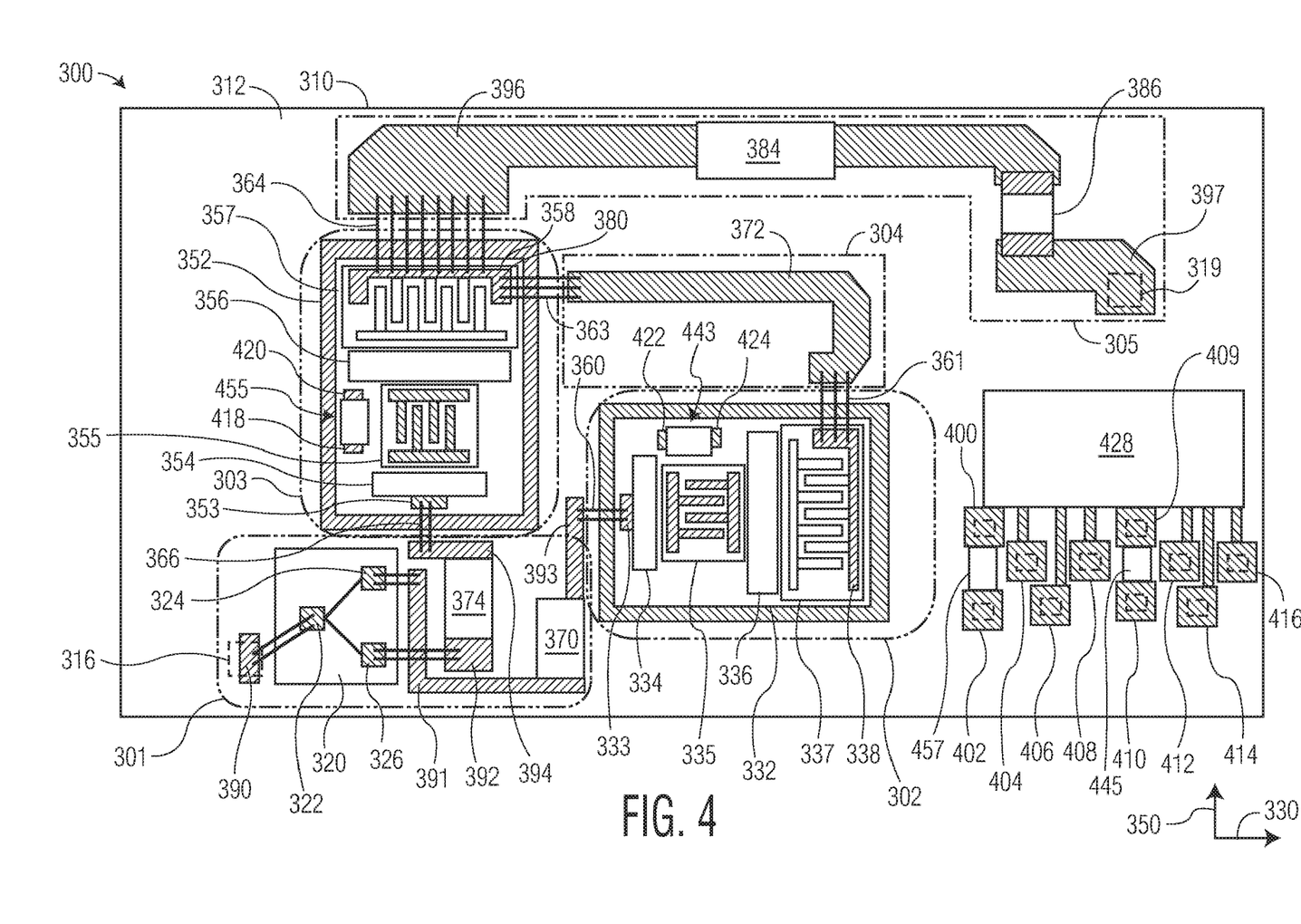
FIG. 4 is a top plan view of a Doherty amplifier module, in accordance with an example embodiment.

An embodiment of a physical implementation of the Doherty amplifier system 20 of FIG. 1, FIG. 2, and FIG. 3 will now be described in detail in conjunction with FIG. 4. More specifically, FIG. 4 is a top plan view of a Doherty amplifier module 300, in accordance with an example embodiment. The Doherty amplifier module 300 includes a substrate 310, a power splitter 320 (e.g., the power splitter 6 of FIG. 1), a carrier amplifier die 332 comprising the dual stage carrier amplifier 24 of FIGS. 1-3, a peaking amplifier die 352 comprising the dual stage peaking amplifier 26 of FIGS. 1-3, a phase shift and impedance inversion element 372 (e.g., second phase shift/impedance inversion/matching component 12 of FIG. 1), a bias controller 428 (e.g., bias controller 28, FIG. 2), and various other circuit elements, which will be discussed in more detail below.

The Doherty amplifier module 300 may be implemented as a land grid array (LGA) module, for example. Accordingly, the substrate 310 has a component mounting surface 312 and a land surface (not illustrated). The component mounting surface 312 and the components mounted to that surface 312 optionally may be covered with an encapsulant material (e.g., a plastic encapsulant). In an alternate embodiment, the components can be contained within an air cavity, which is defined by various structures (not illustrated) overlying the mounting surface 312.

According to an embodiment, the substrate 310 is relatively small, which provides for a particularly compact Doherty amplifier. For example, the component mounting surface 312 may have a width (horizontal dimension in FIG. 4) and a length (vertical dimension in FIG. 4) in a range of about 5 millimeters (mm) to about 20 mm, although the width and/or length may be smaller or larger, as well. In a particular embodiment, for example, the component mounting surface may have a width of about 10 millimeters (mm) and a length of about 6 mm.

For example, the substrate 310 may be a multi-layer organic substrate (e.g., formed from PCB materials) with a plurality of metal layers which are separated by dielectric material. According to an embodiment, the bottom metal layer is utilized to provide externally-accessible, conductive landing pads of the LGA, where the locations of some example landing pads are indicated with dashed boxes in FIG. 4. These landing pads (among others, not illustrated) enable surface mounting of the Doherty amplifier module 300 onto a separate substrate (not illustrated) that provides electrical connectivity to other portions of an RF system. Although the module 300 is depicted as an LGA module, the module 300 alternatively may be packaged as a pin grid array module, a quad flat no leads (QFN) module, or another type of package.

One or more metal layers of the substrate 310 may be used to convey DC voltages (e.g., DC bias voltages) and to provide a ground reference. Other layers may be used to convey RF and other signals through the module 300. Additionally, a patterned metal layer may be formed on the mounting surface 312 of the substrate 310. As will be discussed in more detail below, the patterned metal layer may include a plurality of conductive contacts and traces on the mounting surface 312, which facilitate electrical connection to die and other components that may be mounted to the mounting surface 312. In addition, the phase shift and impedance inversion element 372 may be formed from a portion of the patterned metal layer or from portions of one or more other conductive layers. Conductive vias can be provided for electrical connectivity between the metal layers.

Each of the carrier and peaking amplifier dies 332 and 352 is a monolithic power transistor integrated circuit (IC) that may produce significant amounts of heat during operation. In addition, each of the carrier and peaking amplifier dies 332 and 352 also needs access to a ground reference. Accordingly, in an embodiment, the substrate 310 also includes a plurality of electrically and thermally conductive trenches to which the carrier and peaking amplifier dies 332 and 352 are coupled (e.g., with solder, brazing material, silver sinter, or other die attach materials). The trenches extend through the substrate thickness in first-die and second-die mounting zones 302, 303 to provide heat sinks and ground reference access to the carrier and peaking amplifier dies 332 and 352. For example, the conductive trenches may be filled with copper or another thermally and electrically conductive material. In alternate embodiments, the trenches may be replaced with conductive slugs (e.g., copper slugs) or with thermal vias.

As seen in FIG. 4, a plurality of non-overlapping zones are defined at the mounting surface 312 of the substrate 310. More specifically, the non-overlapping zones include an input signal and splitter zone 301, the first-die mounting zone 302, the second-die mounting zone 303, an inter-amplifier impedance inverter zone 304, and an output match zone 305. Within the input signal and splitter zone 301, a conductive landing pad 316 exposed at the land surface is electrically coupled through the substrate 310 to a conductive contact 390 at the mounting surface 312. The landing pad 316 and the contact 390, along with the electrical connections between them, function as an RF input node (e.g., RF input node 2 of FIG. 1) for the module 300.

The power splitter 320 is coupled to the mounting surface 312 in the input signal zone 301. According to an embodiment, the power splitter 320 may include one or more discrete dies and/or components, although it is represented in FIG. 3 as a single element. The power splitter 320 includes an input terminal 322 and two output terminals 324, 326. The input terminal 322 is electrically coupled (e.g., through wirebonds, as shown) to the conductive contact 390 to receive an input RF signal. In addition, the output terminals 324, 326 are respectively electrically coupled (e.g., through additional wirebonds, as shown) to respective conductive contacts 391, 392 at the mounting surface 312. The power splitter 320 is configured to split the power of the input RF signal received through the input terminal 322 into first and second RF signals (e.g., carrier and peaking signals), which are produced at the output terminals 324, 326. In addition, the power splitter 320 may include a first phase shift element configured to impart about a 90 degree phase shift to the RF signal provided at the output terminal 326, as compared with the RF signal provided at the output terminal 324 (e.g., represented by the first phase shift/impedance inversion/matching component 10 of FIG. 1). The power splitter 320 may consist of fixed-value, passive components, or the power splitter 320 may include variable phase shifters and/or attenuators.

The first and second RF signals may have equal or unequal power. The first RF signal produced at the output terminal 324 and conveyed to the conductive contact 391 is amplified through a carrier amplifier path. The carrier amplifier path includes an input circuit 370 mounted within the input signal zone 301, the carrier amplifier die 332 mounted within the first-die mounting zone 302, and the impedance inversion element 372 connected to the substrate 310 within the inter-amplifier impedance inverter zone 304.

The input circuit 370 is electrically connected between the conductive contact 391 and a conductive contact 393. Although the detail is not shown in FIG. 4, the input circuit 370 may include a plurality of discrete and/or integrated components (e.g., inductors and capacitors) configured to provide proper impedance matching between the output terminal 324 and the input to the carrier die 332.

The conductive contact 393 is electrically coupled (e.g., with wirebonds 360) to an RF input terminal 333 of the carrier amplifier die 332, in order to provide an RF carrier signal for amplification to the carrier amplifier die 332. The illustrated embodiment of the carrier amplifier die 332 embodies a two-stage amplifier. More specifically, the electrical components of the carrier amplifier die 332 include the RF input terminal 333, an input matching network 334, a driver transistor 335 (e.g., the first PA device 40 of FIGS.

2-3), an interstage matching network 336, an output transistor 337 (e.g., the second PA device 42 of FIGS. 2-3), an RF output terminal 338, and a first reference device 443 (e.g., reference device 43, FIG. 3). The driver and output transistors 335, 337 are coupled in series between the input and output terminals 333, 338. The driver transistor 335 is configured to apply a relatively low gain to the carrier signal, and the output transistor 337 is configured to apply a relatively high gain to the carrier signal after preliminary amplification by the driver transistor 335. In other embodiments, the carrier amplifier die 332 may embody a single stage amplifier, or may include more than two amplification stages. As discussed above, the first reference device 443 is integrally formed on the carrier amplifier die 332 with the driver transistor 335 and the output transistor 337 to match the driver transistor 335 and the output transistor 337 in terms of part to part (die to die) process and temperature variations. As described in more detail below, bias circuitry connections 409, 410, 412, 414, 416, 422, and 424 may couple the first reference device 443 to both the bias controller 428 and one terminal of a first high tolerance drain resistor 445 (e.g., first high tolerance drain resistor 45, FIG. 3), and may couple portions of both the driver transistor 335 and the output transistor 337 to the bias controller 428.

Each of the transistors 335, 337 and the first reference device 443 may be a field effect transistor (FET) (such as a metal oxide semiconductor FET (MOSFET), a laterally diffused MOSFET (LDMOS FET), a high electron mobility transistor (HEMT), and so on). Alternatively, each of the transistors 335, 337 and the first reference device 443 may be a bipolar junction transistor (BJT). References herein to a "gate," "drain," and "source," which are commonly used to describe FETs, are not intended to be limiting, as each of these designations has analogous features for BJT implementations.

The input terminal 333 of die 332 is electrically coupled to the gate terminal of transistor 335 through the input matching network 334, and the drain terminal of transistor 335 is electrically coupled to the gate terminal of transistor 337 through the inter-stage matching network 336. According to an embodiment, the drain terminal of the transistor 337 is electrically coupled to the output terminal 338. Accordingly, the signal path through the carrier amplifier die 332 is in a direction extending from the RF input terminal 333 toward the RF output terminal 338, which direction is indicated by an arrow 330.

An amplified RF carrier signal is produced by the carrier amplifier die 332 at the RF output terminal 338. In an embodiment, the RF output terminal 338 is electrically coupled to a first end of phase shift and impedance inversion element 372, which is at least partially exposed at the mounting surface 312, with a first wirebond array 361 (e.g., a plurality of parallel, closely spaced wirebonds).

According to an embodiment, the RF output terminal 338 of the carrier amplifier die 332 includes an elongated first pad that is configured to enable wirebonds of the wirebond array 361 to be connected to the first pad so that the wirebonds extend in a direction that is angularly offset from (e.g., perpendicular to) the direction of the signal path through the carrier amplifier die 332 (e.g., wirebonds of the wirebond array 361 may extend in the direction indicated by an arrow 350).

As mentioned above, through the wirebond array 361, the RF output terminal 338 is electrically coupled to the phase shift and impedance inversion element 372, which is located in the inter-amplifier impedance inverter zone 304. According to an embodiment, the phase shift and impedance inversion element 372 is implemented with a transmission line (e.g., a microstrip line) having an electrical length of about lambda/4 ($\lambda$/4) or less. The transmission line has a first end that is proximate to the carrier amplifier die 332 (and more particularly within a wirebond length of the RF output terminal 338), and a second end that is proximate to the peaking amplifier die 352 (and more particularly within a wirebond length of a RF output terminal 358 of the peaking amplifier die 352). As used herein, "within a wirebond length" means within a distance between about 125 microns and about 200 microns, although the term may mean a smaller or larger distance, as well. According to an embodiment, the phase shift and impedance inversion element 372 may be formed from a portion of one or more of the metal layers of the module substrate 310 and/or may be formed on a surface of the module substrate 310.

Moving back to the power splitter 320 in the input signal and splitter zone 301, the second RF signal (e.g., the peaking signal) produced at the output terminal 326 of the power splitter 320 and conveyed to the conductive contact 392 is amplified through a peaking amplifier path. The peaking amplifier path includes an input circuit 374 within the input signal and splitter zone 301, and the peaking amplifier die 352 mounted within the second-die mounting zone 303. As mentioned above, the power splitter 320 may impart about a 90 degree phase shift to the RF signal provided at the output terminal 326. Accordingly, the phase of the peaking signal received at an input terminal 353 of the peaking die 352 is delayed by about 90 degrees with respect to the carrier signal received at the input terminal 333 of the carrier die 332.

The input circuit 374 is electrically connected between the conductive contact 392 and a conductive contact 394. Although the detail is not shown in FIG. 4, the input circuit 374 may include a plurality of discrete and/or integrated components (e.g., inductors and capacitors) configured to provide proper impedance matching between the output terminal 326 and the input to the peaking die 352.

The conductive contact 394 is electrically coupled (e.g., with wirebonds 366) to the RF input terminal 353 of the peaking amplifier die 352, in order to provide an RF peaking signal for amplification to the peaking amplifier die 352. The illustrated embodiment of peaking amplifier die 352 also embodies a two-stage amplifier. More specifically, the electrical components of peaking amplifier die 352 include the RF input terminal 353, an input matching network 354, a driver transistor 355, an interstage matching network 356, an output transistor 357, the RF output terminal 358, and a second reference device 455 (e.g., reference device 55, FIG. 3). The driver and output transistors 355, 357 are coupled in series between the input and output terminals 353, 358. The driver transistor 355 is configured to apply a relatively low gain to the peaking signal, and the output transistor 357 is configured to apply a relatively high gain to the peaking signal after preliminary amplification by the driver transistor 355. In other embodiments, the peaking amplifier die 352 may embody a single stage amplifier, or may include more than two amplification stages. As discussed above, the second reference device 455 is integrally formed on the peaking amplifier die 352 with the driver transistor 355 and the output transistor 357 to match the driver transistor 355 and the output transistor 357 in terms of part to part (die to die) process and temperature variations. As described in more detail below, bias circuitry connections 400, 402, 404, 406, 408, 418, and 420 may couple the second reference device 455 to both the bias controller 428 and one terminal of a second high tolerance drain resistor 457 (e.g., resistor 57, FIG. 3), and portions of the driver transistor 355 and the output transistor 357 to the bias controller 428. Again, each of the transistors 355, 357 and the second reference device 455 may be a FET or a BJT.

The input terminal 353 of die 352 is electrically coupled to the gate terminal of transistor 355 through the input matching network 354, and the drain terminal of transistor 355 is electrically coupled to the gate terminal of transistor 357 through the inter-stage matching network 356. According to an embodiment, the drain terminal of transistor 357 is electrically coupled to output terminal 358. Accordingly, the signal path through the peaking amplifier die 352 is in a direction extending from the RF input terminal 353 toward the RF output terminal 358, which direction is indicated by the arrow 350.

An amplified RF peaking signal is produced by the peaking amplifier die 352 at the RF output terminal 358. In an embodiment, and as mentioned above, the RF output terminal 358 is electrically coupled to the impedance inversion element 372 with a first wirebond array 363, and the RF output terminal 358 functions as a combining node 380 (e.g., the combining node 8 of FIG. 1) at which the amplified and delayed carrier amplifier signal is combined, in phase, with an amplified peaking amplifier signal.

The RF output terminal 358 of the peaking amplifier die 352 includes an elongated first pad that is configured to enable wirebonds of the first wirebond array 363 to be connected to the first pad so that the wirebonds extend in a direction that is angularly offset from (e.g., perpendicular to) the direction of the signal path through the peaking amplifier die 352 (e.g., wirebonds 363 may extend in the direction indicated by the arrow 330). Further, the RF output terminal 358 may include an elongated second pad that is configured to enable the wirebonds of a second wirebond array 364 to be connected to the second pad so that the wirebonds extend in a direction that is substantially parallel to the direction of the signal path through the peaking amplifier die 352 (e.g., wirebonds of the wirebond array 364 may extend in the direction indicated by arrow 350).

The signal path through the peaking amplifier die 352 is in a direction extending from the RF input terminal 353 to the RF output terminal 358, which direction is indicated by the arrow 350. By contrast, the signal path through the carrier amplifier die 332 is in a direction extending from the RF input terminal 333 to the RF output terminal 338, which direction is indicated by the arrow 330. Thus, as can be seen in FIG. 4, the signal paths through the peaking and carrier amplifier dies 352, 332 extend in significantly different directions, and more particularly the signal paths are perpendicular in the embodiment of FIG. 4.

According to an embodiment, except for the configurations of the RF output terminals 338, 358, the peaking amplifier die 352 may be structurally identical to the carrier amplifier die 332, meaning that the two dies 332, 352 include the same structural and electrical elements arranged and interconnected in the same manner. According to a further embodiment, the peaking amplifier die 352 and the carrier amplifier die 332 also are identical in size, rendering the Doherty amplifier module 300 a symmetric Doherty amplifier. In an alternate embodiment, the peaking amplifier die 352 and the carrier amplifier die 332 may have different sizes, rendering the Doherty amplifier module 300 an asymmetric Doherty amplifier. For example, the peaking amplifier die 352 may be larger than the carrier amplifier die 332 by a ratio (e.g., 1.6:1, 2:1, or some other ratio).

Either way, each dies 332, 352 is rectangular in shape with parallel first and second sides, and parallel third and fourth sides extending between the first and second sides. In each dies 332, 352, the RF input terminal 333, 353 is proximate to the first side of the die, and portions of the RF output terminal 338, 358 may be proximate to the second side of the die. The first sides of the respective dies 332, 352 are each oriented toward the input signal zone 301, and the first sides of the dies 332, 352 are perpendicularly arranged, with respect to each other, in an embodiment. Said another way, the structurally identical carrier and peaking amplifier dies 332, 352 are coupled to the mounting surface 312 of the substrate 310 so that the dies 332, 352 are perpendicular to each other, rendering the RF signal paths through the dies 332, 352 also perpendicular to each other. Even though the dies 332, 352 may be positioned relatively close together, their perpendicular orientations may significantly reduce coupling between signals carried through and amplified by the dies 332, 352.

As mentioned above, through the wirebond array 363, the RF output terminal 358 is electrically coupled to phase shift and impedance inversion element 372. Accordingly, the amplified carrier signal produced by the carrier amplifier die 332 is received at the RF output terminal 358 of the peaking amplifier die 352 through the wirebond array 361, phase shift and impedance inversion element 372, and wirebond array 363. The amplified peaking signal produced by the peaking amplifier die 352 also is received at the RF output terminal 358, and the module 300 is configured so that the amplified carrier and peaking signals arrive and are combined at output terminal 358 (or combining node 380) in phase with each other.

According to an embodiment, the RF output terminal 358 (or combining node 380) is electrically coupled to a conductive output trace 396 at the mounting surface 312 with the wirebond array 364. As illustrated in FIG. 4, the wirebonds of the wirebond array 364 are aligned in the same direction as the RF signal path through the peaking amplifier die 352 (e.g., in the direction indicated by arrow 350). In an embodiment, the wirebond arrays 363, 364 are perpendicularly arranged with respect to each other at adjacent sides of die 352. Accordingly, even though the wirebond arrays 363, 364 may be positioned relatively close together, their perpendicular orientations may significantly reduce coupling of RF signals carried through the wirebond arrays 363, 364.

An output impedance matching network 384 (e.g., third phase shift/impedance inversion/matching component 14 of FIG. 1) and/or a decoupling capacitor 386 may be coupled along the output trace 396, in an embodiment. The output impedance matching network 384 functions to present the proper load impedance to the combining node 380. Although the detail is not shown in FIG. 4, the output impedance matching network 384 may include various discrete and/or integrated components (e.g., capacitors, inductors, and/or resistors) to provide the desired impedance matching. The output impedance matching network 384 is electrically coupled through the substrate 310 to a conductive landing pad 319 exposed at the land surface. The landing pad 319 functions as an RF output node (e.g., RF output node 4 of FIG. 1) for the module 300.

Module 300 also may include the first and second high tolerance drain resistors 445, 457 (e.g., discrete surface mount resistors corresponding to resistors 45, 57, FIG. 3) and the bias circuitry connections 400, 402, 404, 406, 408, 409, 410, 412, 414, 416, 418, 420, 422, and 424 configured to couple portions of the driver and output transistors 335, 355, 337, 357 and portions of the first and second reference devices 443 and 455 to the bias controller 428. According to an embodiment, the bias controller 428 embodies the circuitry of bias controller 28, FIGS. 2-3, including the DACs 56 and 58, FIG. 3. Bias controller 428 also may include one or more voltage sources (e.g., voltage source 47, FIG. 3), or such voltage sources may be separate from bias controller 428, with appropriate electrical connections between the voltage sources and bias controller 428. According to an embodiment, bias controller 428 may be implemented as a bias controller die with a semiconductor die with bump connections on a top surface, where the die is flipped and the bump connections are aligned with and attached to corresponding contacts at the mounting surface 312 of the module substrate 310. In an alternate embodiment, the bias controller 428 may be implemented, for example, as a surface mount device (e.g., a QFN device) with a plurality of contacts at a bottom surface, which are configured to align and connect with corresponding contacts at the mounting surface 312 of the module substrate 310.

In addition to bias controller 428, the bias circuitry may include, among other things, a plurality of landing pads (at the land surface of the substrate 310), contacts (at the mounting surface 312 of the substrate 310), and other conductive structures and circuitry, such as wirebonds, conductive vias and routing structures within the module substrate 310. An electrical connection between the bias controller 428 and each of the various transistors 335, 337, 355, 357, 443, 455 may include, for example, a first contact of the bias controller 428 (e.g., on a top or bottom surface of the bias controller 428), a corresponding second contact on the mounting surface 312 of the module substrate 310, a conductive path through the module substrate 310 (e.g., including conductive vias and routing traces) between the second contact and a third contact on the mounting surface 312 of the module substrate 310, and one or more wirebonds (not illustrated) between the third contact and a fourth contact on the top surface of the carrier or peaking die 332, 352, where the fourth contact is electrically connected to a corresponding transistor 335, 337, 355, 357, 443, 455. In an alternate embodiment, the carrier and peaking dies 332, 352 also may be flip-chip dies with bump connections on a top surface that are configured to align with and connect to corresponding contacts at the mounting surface 312 of the module substrate 310.

For example, in the present example embodiment of FIG. 4, contacts 418, 420 may be electrically connected within die 352 to the drain and gate, respectively, of reference device 455, and contacts 422, 424 may be electrically connected within die 332 to the drain and gate, respectively, of reference device 443. Additional contacts (not shown) on the top surfaces of dies 332, 352 may connect to the gate of transistor 335, the gate of transistor 337, the gate of transistor 355, and the gate of transistor 357.

The bias circuitry connection 400 may be electrically connected with the bias circuitry connection 418 through various conductive structures (e.g., vias, traces, wirebonds) to couple the drain of the second reference device 455 to one terminal of the second high tolerance drain resistor 547 and to a first input of the bias controller 428. The bias circuitry connection 402 couples a second terminal of the second high tolerance drain resistor 457 to a DC voltage source (e.g., the DC voltage source 47 of FIG. 3). The bias circuitry connection 404 connects with the bias circuitry connection 420 through various conductive structures (e.g., vias, traces, wirebonds) to couple the gate of the second reference device 455 to a first output of the bias controller 428. The bias circuitry connection 406 couples the gate of the drive transistor 355 (e.g., the transistor 52 of FIGS. 2-3) to a second output of the bias controller 428 (e.g., a first output of the switching logic 58 of FIG. 3) through various conductive structures (e.g., vias, traces, wirebonds), and the bias circuitry connection 408 couples the gate of the output transistor 357 (e.g., the transistor 54 of FIGS. 2-3) to a third output of the bias controller 428 (e.g., a second output of the switching logic 58 of FIG. 3) through various conductive structures (e.g., vias, traces, wirebonds).

Correspondingly, in the present example embodiment, the bias circuitry connection 409 connects with the bias circuitry connection 422 through various conductive structures (e.g., vias, traces, wirebonds) to couple the drain of the first reference device 443 to one terminal of the first high tolerance drain resistor 445 and a second input of the bias controller 428. The bias circuitry connection 410 couples a second terminal of the first high tolerance drain resistor 445 to the DC voltage source (e.g., the DC voltage source 47 of FIG. 3). The bias circuitry connection 412 connects with the bias circuitry connection 424 through various conductive structures (e.g., vias, traces, wirebonds) to couple the gate of the first reference device 443 to a fourth output of the bias controller 428. The bias circuitry connection 414 couples the gate of the drive transistor 335 (e.g., the transistor 40 of FIGS. 2-3) to a fifth output of the bias controller 428 (e.g., a first output of the switching logic 56 of FIG. 3) through various conductive structures (e.g., vias, traces, wirebonds), and the bias circuitry connection 416 couples the gate of the output transistor 337 (e.g., the transistor 42 of FIGS. 2-3) to a sixth output of the bias controller 428 (e.g., a second output of the switching logic 56 of FIG. 3) through various conductive structures (e.g., vias, traces, wirebonds).

The bias controller 428 provides appropriate bias voltages to the transistors 335, 337 of the carrier amplifier die 332 and the transistors 355, 357 of the peaking amplifier die 352 by employing the first and second reference devices 443 and 455 as described above in connection with FIG. 2. For example, when a transceiver in which the module 300 is incorporated is configured to perform the transmit function, the bias controller 428 may bias the transistors 335, 337 of the carrier amplifier die 332 to operate in class AB (or class C) mode, and the transistors 355, 357 of the peaking amplifier die 352 to operate in class C (or class AB) mode. Furthermore, the bias controller 28 provides for fast switching of the carrier and peaking amplifier dies 332, 352 between respective on and off states by employing the first, second, third, and fourth charge holding capacitors 32, 36, 44, and, 48 and the first, second, third, and fourth switches 34, 38, 46, and 50 as described above in connection with FIGS. 2 and 3.

Figure 5:
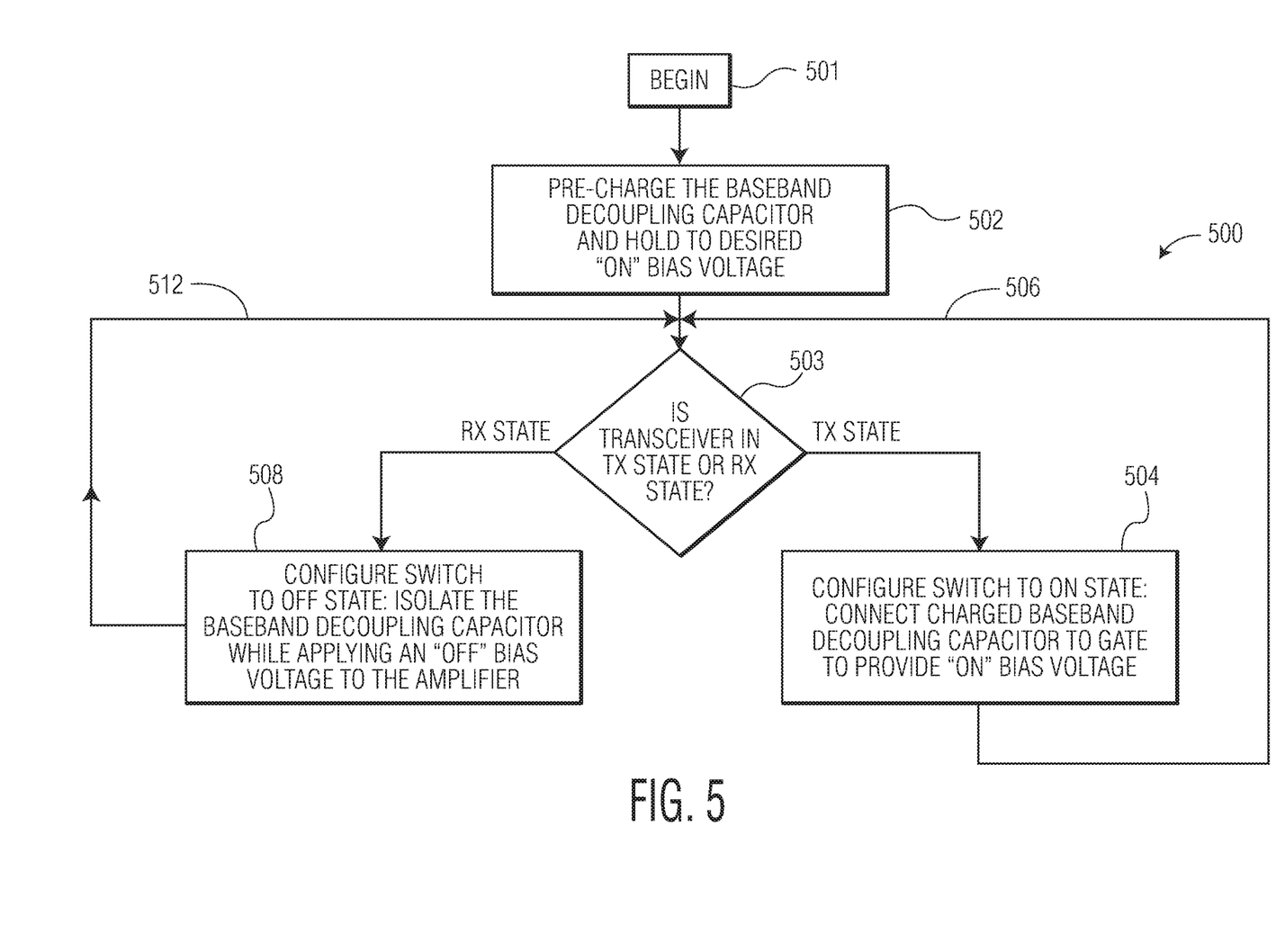
FIG. 5 is a flowchart of a method of operating a Doherty amplifier module, in accordance with an example embodiment.

FIG. 5 is a flow diagram of a method of operation 500 for both the Doherty amplifier system 20 of FIGS. 1-3 and the Doherty amplifier module 300 of FIG. 4. As seen in FIG. 5, the method 500 upon commencing at a begin step 501 can start by pre-charging the first, second, third, and fourth charge holding capacitors 32, 36, 44, and, 48 to the first, second, third, and fourth on state voltages respectively, at a step 502. Following the pre-charging, the method 500 can include determining whether a transceiver implementing TDD operation and employing the Doherty amplifier system 20 or module 300 is in a transmit state (i.e., configured to perform the transmit function) or in a receive state (i.e., configured to perform the receive function), as at a step 503. When in the transmit state, the bias controller 28 or 428 can configure (e.g., through switch control signals) the first, second, third, and fourth switches 34, 38, 46, and 50 to couple the respective first electrode of the first, second, third, and fourth charge holding capacitors 32, 36, 44, and, 48 to the respective gates of the first, second, third, and fourth PA devices 40, 42, 52, and 54 (e.g., transistors 335, 337, 355, and 357) to provide the first, second, third, and fourth PA devices 40, 42, 52, and 54 with the first, second, third, and fourth on state voltages respectively, as at a step 504. At a time subsequent to the commencement of the step 504, the method 500 then returns to determining the transceiver state (at the step 503) as represented by an arrow 506. In some embodiments, the method 500 returns to determining the transceiver state (at the step 503) immediately following completion of step 504. When in the receive state, the bias controller 28 or 428 can configure (e.g., through switch control signals) the first, second, third, and fourth switches 34, 38, 46, and 50 to isolate the respective first electrodes 33, 35, 37, 39 of the first, second, third, and fourth charge holding capacitors 32, 36, 44, and 48 from the respective PA devices 40, 42, 52, and 54, respectively. As discussed above, this is achieved by coupling the respective gates of the first, second, third, and fourth PA devices 40, 42, 52, and 54 to the first, second, third, and fourth off state voltages respectively, as at a step 508. At a time subsequent to the commencement of the step 506 the method then returns to determining the transceiver state (at the step 502) as represented by an arrow 512. In some embodiments, the method 500 returns to determining the transceiver state (at the step 502) immediately following completion of step 508.

The present disclosure is intended to encompass numerous embodiments in addition to that described above. For example, although the above-described configurations of FIGS. 1-4 correspond to a non-inverted Doherty amplifier, in an alternate embodiment, modifications can be made to configure the amplifier 20 and/or module 300 to operate as an inverted Doherty amplifier. Additionally, although the above described embodiments include two-way Doherty power amplifier implementations, which include a carrier amplifier and one peaking amplifier, other embodiments are intended to be encompassed herein. Further for example, according to some such other embodiments, a Doherty power amplifier may include more than one peaking amplifier, or the amplifier 20 or module 300 may be modified to implement types of amplifiers other than Doherty amplifiers. Said another way, amplifiers and modules configured to work with the bias controller 28 or with other bias controllers of a substantially or largely similar form may be utilized in amplifier configurations other than those illustrated and discussed herein. Notwithstanding the above description concerning FIG. 5, the present disclosure is also intended to encompass numerous other embodiments of methods of operating amplifiers and amplifier systems. Indeed, various modifications may be made to the amplifier 20 and/or module 300 without departing from the scope of the present disclosure.

Additionally, in at least some embodiments, the present disclosure additionally relates to a system that can include a first power amplifier and a bias voltage generator configured to generate one or more bias voltages at one or more outputs of the bias voltage generator. The system can also include a first charge holding capacitor having a first electrode electrically coupled to a first output of the bias voltage generator. The system can also include a first switch selectively coupling, based on a first control signal, a first input of the first power amplifier either to the first electrode of the first charge holding capacitor or to a first off state bias voltage. When the first input of the first power amplifier is electrically coupled to the first electrode of the first charge holding capacitor, the first charge holding capacitor provides a first on state bias voltage to the first input of the first power amplifier.

Additionally, in at least some embodiments, the present disclosure additionally relates to an amplifier that can include a substrate with a mounting surface and a bias controller die coupled to the substrate. The bias controller die includes a bias voltage generator, a first charge holding capacitor having a first electrode electrically coupled to a first output of the bias voltage generator, a second charge holding capacitor having a first electrode electrically coupled to a second output of the bias voltage generator, a first switch, and a second switch. The amplifier can include a first amplifier die coupled to the substrate and a second amplifier die coupled to the substrate. The first switch selectively couples a first input of the first amplifier die either to the first electrode of the first charge holding capacitor or to a first off state voltage based on a first control signal. The second switch selectively couples a first input of the second amplifier die either to the first electrode of the second charge holding capacitor or to a second off state voltage based on a second control signal. When the first input of the first amplifier die is electrically coupled to the first electrode of the first charge holding capacitor, the first charge holding capacitor provides a first on state voltage to the first input of the first amplifier die. When the first input of the second amplifier die is electrically coupled to the first electrode of the second charge holding capacitor, the second charge holding capacitor provides a second on state voltage to the first input of the second amplifier die.

Additionally, in at least some embodiments, the present disclosure additionally relates to a method that can include determining whether a transceiver is in a transmit state or a receive state. When the transceiver is in the transmit state, the method can include transitioning a switch to an on state to electrically couple a first electrode of a charge holding capacitor to an input of a power amplifier. The charge holding capacitor can provide an on state voltage to the input of the power amplifier. When the transceiver is in the receive state, the method can include transitioning the switch to an off state to couple the input of the power amplifier to an off state voltage.

In view of the above description, it should be appreciated that, depending upon the embodiment, one or more of the embodiments of amplifiers, systems employing amplifiers, and/or related methods described herein or encompassed by the present disclosure can achieve operation that is advantageous in one or more respects. For example, such systems and methods as described herein can facilitate fast switching of power amplifier components between a respective on state voltage and a respective off state voltage by employing low impedance switches and charge holding capacitors that are pre-charged to the respective on state voltage.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

Accordingly, it is specifically intended that the present invention not be limited to the embodiments and illustrations contained herein, but include modified forms of those embodiments including portions of the embodiments and combinations of elements of different embodiments as come within the scope of the following claims.

What is claimed is:

1. A system comprising:
a first power amplifier with a first input;
a bias voltage generator configured to generate one or more bias voltages at one or more outputs of the bias voltage generator;
a first charge holding capacitor having a first electrode electrically coupled to a first output of the bias voltage generator;
a first multi-throw switch with a first terminal coupled to the first output of the bias voltage generator and to the first electrode of the charge holding capacitor, a second terminal coupled to a first off state bias voltage, and a third terminal coupled to the first input of the first power amplifier, wherein the first multi-throw switch is configured to selectively couple, based on a first control signal, the first input of the first power amplifier either to the first electrode of the first charge holding capacitor or to the first off state bias voltage; and
an RF-gate decoupling capacitor having a first electrode coupled to the first input of the first power amplifier, and a second terminal coupled to a ground reference, wherein a capacitance value of the first charge holding capacitor is greater than a capacitance value of the RF-gate decoupling capacitor, and
wherein, when the first input of the first power amplifier is electrically coupled to the first electrode of the first charge holding capacitor through the first multi-throw switch, the first charge holding capacitor energizes the RF-gate decoupling capacitor and provides a first on state bias voltage to the first input of the first power amplifier.

2. The system of claim 1, wherein the first power amplifier has a first stage and a second stage, the system further comprising:
a second charge holding capacitor having a first electrode electrically coupled to a second output of the bias voltage generator; and
a second switch selectively coupling, based on a second control signal, a second input of the first power amplifier either to the first electrode of the second charge holding capacitor or to a second off state bias voltage,
wherein, when the second input of the first power amplifier is electrically coupled to the first electrode of the second charge holding capacitor, the second charge holding capacitor provides a second on state bias voltage to the second input of the first power amplifier.

3. The system of claim 2 further comprising:
a second power amplifier having a first stage and a second stage;
a third charge holding capacitor having a first electrode electrically coupled to a third output of the bias voltage generator;
a fourth charge holding capacitor having a first electrode electrically coupled to a fourth output of the bias voltage generator;
a third switch selectively coupling, based on a third control signal, a first input of the second power amplifier either to the first electrode of the third charge holding capacitor or a third off state voltage; and
a fourth switch selectively coupling, based on a fourth control signal, a second input of the second power amplifier either to the first electrode of the fourth charge holding capacitor or to a fourth off state voltage,
wherein, when the first input of the second power amplifier is electrically coupled to the first electrode of the third charge holding capacitor, the third charge holding capacitor provides a third on state voltage to the first input of the second power amplifier, and
wherein, when the second input of the second power amplifier is electrically coupled to the first electrode of the fourth charge holding capacitor, the fourth charge holding capacitor provides a fourth on state voltage to the second input of the second power amplifier.

4. The system of claim 3, wherein the first input of the first power amplifier is electrically coupled to an input of a first stage of the first power amplifier, an output of the first stage of the first power amplifier is electrically coupled to an input of a second stage of the first power amplifier, the second input of the first power amplifier is electrically coupled to the input of the second stage of the first power amplifier, the first input of the second power amplifier is electrically coupled to an input of a first stage of the second power amplifier, an output of the first stage of the second power amplifier is electrically coupled to an input of a second stage of the second power amplifier, and the second input of the second power amplifier is electrically coupled to the input of the second stage of the second power amplifier.

5. The system of claim 4, wherein the respective first stage of the first power amplifier and the first stage of the second power amplifier each include a respective pre-driver stage, and the second stage of the first power amplifier and the second stage of the second power amplifier each include a respective output driver stage.

6. The system of claim 3, wherein the first control signal is equal in value to the second control signal, the third control signal, and the fourth control signal, and
wherein the first off state voltage for the first power amplifier is equal to the second off state voltage for the first power amplifier, the third off state voltage for the second power amplifier, and the fourth off state voltage for the second power amplifier.

7. The system of claim 1, wherein the first off state voltage is a ground reference voltage.

8. The system of claim 1, wherein the capacitance value of the first charge holding capacitor is several orders of magnitude greater than the capacitance value of the RF-gate decoupling capacitor.

9. The system of claim 1, wherein the first multi-throw switch transitions between connecting the first input of the first power amplifier to the first electrode of the first charge holding capacitor and connecting the first input of the first power amplifier to the first off state voltage in less than one micro second.

10. The system of claim 1, wherein the system forms a portion of a transceiver that is configured to provide a transmit function in a transmit state and a receive function in a receive state, and the bias voltage generator includes switching logic that simultaneously drives the first output of the bias voltage generator and the second output of the bias voltage generator selectively between the first on state voltage and the first off state voltage based on whether the transceiver currently is configured to provide the transmit function or the receive function.

11. The system of claim 10, wherein the first control signal is synchronized with the transmit state and the receive state such that, when the transceiver is in the transmit state, the switching logic drives the first output of the bias voltage generator and the second output of the bias voltage generator to the first on state voltage, the first multi-throw switch, simultaneously therewith, electrically couples the first input of the first power amplifier to the first electrode of the first charge holding capacitor, and, when the transceiver is in the receive state, the switching logic drives the first output of the bias voltage generator and the second output of the bias voltage generator to the first off state voltage, and the first multi-throw switch, simultaneously therewith, electrically couples the first input of the first power amplifier to the first off state voltage.

12. An amplifier comprising:
a substrate with a mounting surface;
a bias controller die coupled to the substrate, wherein the bias controller die includes a bias voltage generator, a first charge holding capacitor having a first electrode electrically coupled to a first output of the bias voltage generator, a second charge holding capacitor having a first electrode electrically coupled to a second output of the bias voltage generator, a first multi-throw switch, and a second multi-throw switch;
a first amplifier die coupled to the substrate that includes a first power amplifier with an input; and
a first RF-gate decoupling capacitor having a first electrode coupled to the input of the first power amplifier, and a second terminal coupled to a ground reference, wherein a capacitance value of the first charge holding capacitor is greater than a capacitance value of the first RF-gate decoupling capacitor;
a second amplifier die coupled to the substrate that includes a second power amplifier with an input; and
a second RF-gate decoupling capacitor having a first electrode coupled to the input of the second power amplifier, and a second terminal coupled to the ground reference,
wherein a capacitance value of the second charge holding capacitor is greater than a capacitance value of the second RF-gate decoupling capacitor, and
wherein the first multi-throw switch has a first terminal coupled to the first output of the bias voltage generator and to the first electrode of the first charge holding capacitor, a second terminal coupled to a first off state bias voltage, and a third terminal coupled to the input of the first power amplifier, wherein the first multi-throw switch is configured to selectively couple the input of the first power amplifier either to the first electrode of the first charge holding capacitor or to the first off state voltage based on a first control signal,
wherein the second multi-throw switch has a first terminal coupled to the second output of the bias voltage generator and to the first electrode of the second charge holding capacitor, a second terminal coupled to a second off state bias voltage, and a third terminal coupled to the input of the second power amplifier, wherein the second multi-throw switch is configured to selectively couple the input of the second power amplifier either to the first electrode of the second charge holding capacitor or to the second off state voltage based on a second control signal,
wherein, when the first input of the first power amplifier is electrically coupled to the first electrode of the first charge holding capacitor through the first multi-throw switch, the first charge holding capacitor energizes the first RF-gate decoupling capacitor and provides a first on state voltage to the input of the first power amplifier, and
wherein, when the first input of the second power amplifier is electrically coupled to the first electrode of the second charge holding capacitor through the second multi-throw switch, the second charge holding capacitor energizes the second RF-gate decoupling capacitor and provides a second on state voltage to the input of the second power amplifier.

13. The amplifier of claim 12 further comprising:
a third power amplifier in the first amplifier die, wherein the third power amplifier has an input;
a third RF-gate decoupling capacitor having a first electrode coupled to the input of the third power amplifier, and a second terminal coupled to the ground reference;
a fourth power amplifier in the second amplifier die, wherein the fourth power amplifier has an input;
a fourth RF-gate decoupling capacitor having a first electrode coupled to the input of the fourth power amplifier, and a second terminal coupled to the ground reference;
a third charge holding capacitor of the bias controller die having a first electrode electrically coupled to a third output of the bias voltage generator;
a fourth charge holding capacitor of the bias controller die having a first electrode electrically coupled to a fourth output of the bias voltage generator;
a third multi-throw switch of the bias controller die; and
a fourth multi-throw switch of the bias controller die,
wherein the third multi-throw switch selectively couples the input of the third power amplifier either to the first electrode of the third charge holding capacitor or to a third off state voltage based on a third control signal,
wherein the fourth multi-throw switch selectively couples the input of the fourth power amplifier either to the first electrode of the fourth charge holding capacitor or a fourth off state voltage based on a fourth control signal,
wherein, when the input of the third power amplifier is electrically coupled to the first electrode of the third charge holding capacitor, the third charge holding capacitor provides a third on state voltage to the input of the third power amplifier, and
wherein, when the input of the fourth power amplifier is electrically coupled to the first electrode of the fourth charge holding capacitor, the fourth charge holding capacitor provides a fourth on state voltage to the input of the fourth power amplifier.

14. The amplifier of claim 13, wherein the first power amplifier is a first stage amplifier of the first amplifier die, the third power amplifier is a second stage amplifier of the first amplifier die, the second power amplifier is a first stage amplifier of the second amplifier die, and the fourth power amplifier is a second stage amplifier of the second amplifier die.

15. The amplifier of claim 14, wherein the respective first stage amplifier of the first amplifier die and the first stage amplifier of the second amplifier die each includes a respective pre-driver stage amplifier, and the respective second stage amplifier of the first amplifier die and the second stage amplifier of the second amplifier die each includes a respective output driver stage amplifier.

16. The amplifier of claim 13, wherein the first control signal is equal in value to the second control signal, the third control signal and the fourth control signal, and
wherein the first off state voltage is equal to the second off state voltage, the third off state voltage, and the fourth off state voltage.

17. The amplifier of claim 13, wherein each of the first multi-throw switch, the second multi-throw switch, the third multi-throw switch, and the fourth multi-throw switch include a relatively-low power transistor.

18. A method comprising:
determining whether a transceiver is in a transmit state or a receive state;
when the transceiver is in the transmit state, transitioning a multi-throw switch to an on state to electrically couple a first electrode of a charge holding capacitor to an input of a power amplifier and to a first electrode of an RF-gate decoupling capacitor that is connected to the input of the power amplifier, the charge holding capacitor providing an on state voltage to the input of the power amplifier and energizing the RF-gate decoupling capacitor, wherein a capacitance value of the charge holding capacitor is greater than a capacitance value of the RF-gate decoupling capacitor; and
when the transceiver is in the receive state, transitioning the multi-throw switch to an off state to couple the input of the power amplifier to an off state voltage.

19. The method of claim 18 further comprising precharging the charge holding capacitor to the on state voltage.

20. The method of claim 18 further comprising:
driving an output of a biasing voltage generator selectively between the on state voltage and the off state voltage based on whether the transceiver is in the transmit state or the receive state;
when the output of the biasing voltage generator is at the on state voltage, the multi-throw switch electrically coupling the input of the power amplifier to the first electrode of the charge holding capacitor; and
when the output of the biasing voltage generator is at the off state voltage, the multi-throw switch electrically coupling the input of the power amplifier to the off state voltage of the power amplifier.

* * * * *